United States Patent
Chiono

(10) Patent No.: US 12,278,574 B2
(45) Date of Patent: *Apr. 15, 2025

(54) SYSTEM AND PROCESS FOR CONTROLLING ELECTRIC MACHINES USING A MEASURING CIRCUIT OF THE VOLTAGE OF THE ELECTRIC MACHINE

(71) Applicant: MAVEL EDT S.P.A., Pont Saint Martin (IT)

(72) Inventor: Denny Chiono, Saint Nicolas (IT)

(73) Assignee: MAVEL EDT S.P.A, Pont Saint Martin (IT)

( * ) Notice: Subject to any disclaimer, the term of this patent is extended or adjusted under 35 U.S.C. 154(b) by 177 days.

This patent is subject to a terminal disclaimer.

(21) Appl. No.: 17/801,288

(22) PCT Filed: Feb. 25, 2020

(86) PCT No.: PCT/IT2020/000025
§ 371 (c)(1),
(2) Date: Aug. 22, 2022

(87) PCT Pub. No.: WO2021/171324
PCT Pub. Date: Sep. 2, 2021

(65) Prior Publication Data
US 2023/0353073 A1  Nov. 2, 2023

(51) Int. Cl.
*H02M 3/157* (2006.01)
*G01R 31/34* (2020.01)
(Continued)

(52) U.S. Cl.
CPC ............ *H02P 21/13* (2013.01); *G01R 31/343* (2013.01); *H02P 21/18* (2016.02); *H02P 21/20* (2016.02)

(58) Field of Classification Search
CPC .. H02M 1/0012; H02M 1/0845; H02M 3/157; H02M 1/007; H02M 1/008;
(Continued)

(56) References Cited

U.S. PATENT DOCUMENTS 9,205,560 B1    12/2015  Edsinger
2005/0275361 A1  12/2005  Bolt
(Continued)

FOREIGN PATENT DOCUMENTS

| EP | 2747272 A1 | 6/2014 |
| JP | H11122974 A | 4/1999 |
| JP | 2006254626 A | 9/2006 |

OTHER PUBLICATIONS

Mollet, Yves et al., "Mechanical-state estimator for doubly-fed induction generators—Application to encoder-fault tolerance and sensorless control," 2014 International Conference on Electrical Machines (ICEM), IEEE, Sep. 2, 2014, pp. 1779-1785.
(Continued)

*Primary Examiner* — Kawing Chan
*Assistant Examiner* — Charles S Laughlin
(74) *Attorney, Agent, or Firm* — UB Greensfelder LLP

(57) ABSTRACT

A control system (200) of an electric machine (80) includes a position sensor (51) configured to detect the angular position of a rotor of the electric machine (80); at least two alternate current sensors (52), each one of the alternate current sensors (52) being configured to detect the value of the alternate current ($i_a$, $i_b$, $i_c$) to an input phase to the electric machine (80), and being electrically connected to a phase of the supply circuit of the electric machine (80), the electric machine (80) being electrically connected to an inverter (60) configured to transform a continuous voltage supplied by the electric supply means into an alternate (Continued)

voltage for a power supply of the electric machine (80); and a measuring circuit (100) of a voltage of an electric machine.

8 Claims, 2 Drawing Sheets

(51) Int. Cl.
*H02P 21/13* (2006.01)
*H02P 21/18* (2016.01)
*H02P 21/20* (2016.01)

(58) Field of Classification Search
CPC .............. H02M 3/156; H02M 3/1588; H02M 7/53871; H02M 1/0009; H02M 1/126; H02M 3/1582; H02M 3/1584; H02M 5/293; H02M 7/48; H02M 7/4807; H02M 7/68; H02M 5/4585; H02M 7/493; H02M 1/00; H02M 1/0043; H02M 1/0054; H02M 1/0074; H02M 1/14; H02M 1/327; H02M 3/1586; H02M 3/33592; H02M 5/2932; H02M 5/458; H02M 7/527; H02M 7/53875; H02P 6/182; H02P 21/22; H02P 6/18; H02P 6/17; H02P 6/21; H02P 6/06; H02P 6/15; H02P 6/20; H02P 25/03; H02P 6/08; H02P 6/085; H02P 6/10; H02P 6/14; H02P 6/153; H02P 6/16; H02P 1/40; H02P 1/46; H02P 21/0089; H02P 21/02; H02P 21/18; H02P 21/26; H02P 21/34; H02P 2101/45; H02P 2203/01; H02P 2203/05; H02P 2207/05; H02P 23/16; H02P 27/06; H02P 27/08; H02P 27/085; H02P 29/024; H02P 29/0241; H02P 29/032; H02P 1/28; H02P 2209/07; H02P 23/0004; H02P 23/0077; H02P 23/183; H02P 23/186; H02P 23/26; H02P 27/02; H02P 3/18; H02P 6/188; H02P 6/22; H02P 7/293; H02P 8/34
See application file for complete search history.

(56) References Cited

U.S. PATENT DOCUMENTS

2006/0290312 A1* 12/2006 Nagai ................. H02P 6/182
318/599
2023/0083791 A1* 3/2023 Chiono ................ G01R 31/343
324/765.01

OTHER PUBLICATIONS

Int'l. Search Report dated Sep. 11, 2020 from Int'l. Application No. PCT/IT2020/000025, 3 pages.

* cited by examiner

SYSTEM AND PROCESS FOR CONTROLLING ELECTRIC MACHINES USING A MEASURING CIRCUIT OF THE VOLTAGE OF THE ELECTRIC MACHINE

BACKGROUND OF THE INVENTION

1) Field of the Invention

The present invention refers to a system and a process for controlling electric machines using a measuring circuit of the voltage of an electric machine.

In particular, the invention refers to a system for controlling electric machines which uses a measuring circuit of the voltage of an electric motor, more in particular for measuring the phase voltages of a synchronous, reluctance electric motor of the type with permanent magnets, but can be used with any type of electric machine; the invention further refers to a process for controlling an electric motor using such circuit.

2) Background Art

In order to control the operation of known electric machines, and in particular of high-performance synchronous electric motors, a parameter which must be kept under control is given by the torque provided as output from the machine.

In order to control the torque, a method is known for estimating the value of the torque provided by the electric machine using: the measure of the angular position of the rotor detected with a position sensor, the measure of the phase currents of the motor with current sensors, the knowledge of the motor parameters (phase inductances, concatenated flux) when the working point changes.

Such known method for controlling the torque provided by an electric machine have the problem that they do not allow verifying the presence of errors in the computed torque value, which can be caused by reading errors of the position and current sensors, which would bring about a wrong estimation of the value of the torque provided by the electric machine, in particular by the motor, with consequent driving errors.

JP-A-2006 254626, JP-A-H11 122974, US-A1-2005/275361, U.S. Pat. No. 9,205,560 B1 and EP-A1-U.S. Pat. No. 2,747,272 disclose prior art control systems and processes of electric machines.

SUMMARY OF THE INVENTION

Object of the present invention is providing a system and a process for controlling electric machines using a measuring circuit of the voltage of an electric machine, to verify the value of the torque provided by the electric machine, by detecting the presence of possible errors.

The above and other objects and advantages of the invention, as will result from the following description, are obtained with a system and a process for controlling electric machines as claimed in the independent claims.

Preferred embodiments of the present invention are the subject matter of the dependent claims.

It is intended that all enclosed claims are an integral part of the present description.

It will be immediately obvious that numerous variations and modifications (for example related to shape, sizes, arrangements and parts with equivalent functionality) can be made to hat is described, without departing from the scope of the invention as detailed in the enclosed claims.

BRIEF DESCRIPTION OF THE DRAWINGS

The present invention will be better described by some preferred embodiments thereof, provided as a non-limiting example, with reference to the enclosed drawings, in which.

DETAILED DESCRIPTION OF PREFERRED EMBODIMENTS

Figure 1:
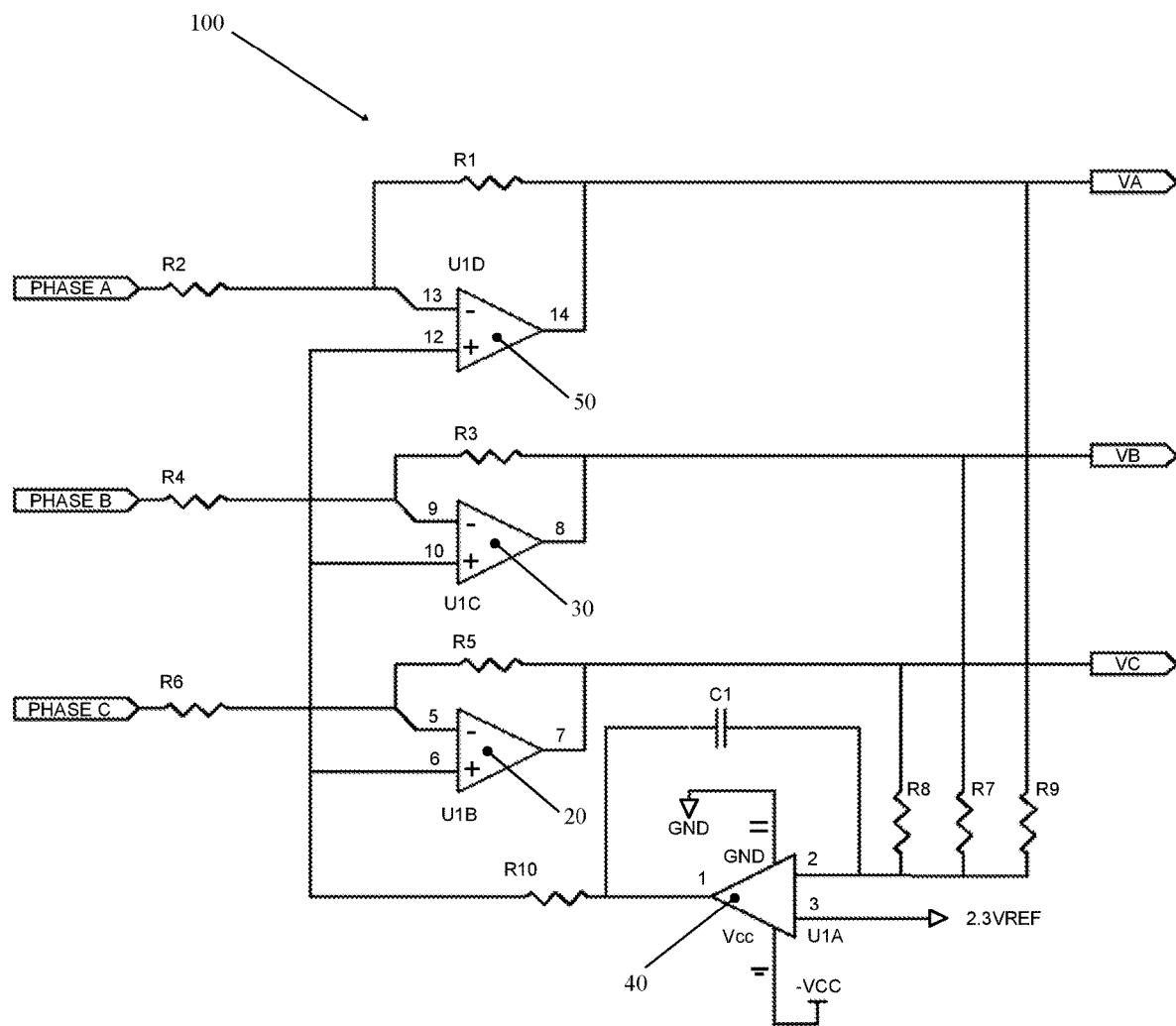
FIG. 1 shows a schematic view of a measuring circuit of the voltage of an electric machine used in a system and process according to the invention.
Figure 2:
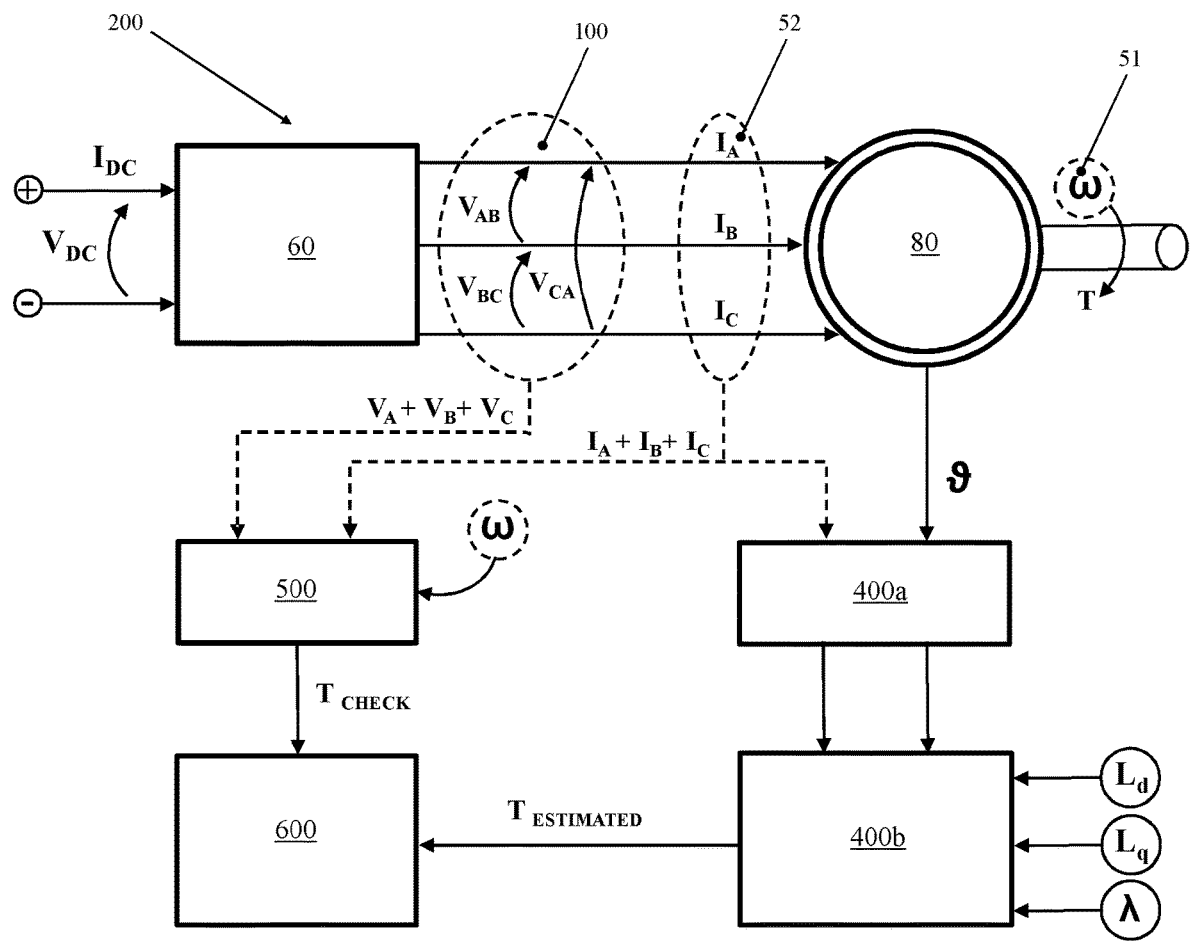
FIG. 2 shows a schematic view of a system for controlling electric machines according to the invention.

With reference to the Figures, the measuring circuit 100 of the voltage of an electric machine used in the system and process of the invention comprises a first operational amplifier 20 having its non-inverting input 5 connected to a non-inverting input 10 of at least one second operational amplifier 30, and its output 7 feedback connected, through a resistance R5, to the inverting input 6, the inverting input 6 of the first operational amplifier 20 being further connected through a resistance R6 to a first phase C of the input current to an electric machine, coming for example from an inverter 60; the output 7 of the first operational amplifier 20 is connected, through a resistance R8, to the inverting input 2 of a third operational amplifier 40 which has its non-inverting input 3 connected to a reference voltage VREF, the output 7 of the first operational amplifier 20 being further connected to a first output VC of the circuit, which is at a voltage value equal to the voltage of a first phase of the electric machine to be measured, the third operational amplifier 40 having its output 1 feedback connected, through a capacitance C1, to the inverting input 2, the output 1 of the third operational amplifier 40 being further connected through a resistance R10 to the non-inverting input 5 of the first operational amplifier 20 and to the non-inverting input 10 of the second operational amplifier 30. The second operational amplifier 30 comprises its output 8 feedback connected, through a resistance R3, to the inverting input 9, the inverting input 9 being further connected through a resistance R4 to a second phase B of the input current to the electric machine, coming for example from the inverter 60; the output 8 of the second operational amplifier 30 is connected, through a resistance R7, to the inverting input 2 of the third operational amplifier 40 and is further connected to a second output VB of the circuit, which is at a voltage value equal to the voltage of a second phase of the electric machine to be measured.

Preferably, the above described measuring circuit 100 of the voltage of an electric machine further comprises a fourth operational amplifier 50 having its non-inverting input 12 connected to the non-inverting input 5, 10 of the first 20 and of the second 30 operational amplifier, and its output 14 feedback connected, through a resistance R1, to the inverting input 13, the inverting input 13 being further connected through a resistance R2 to a third phase A of the input current to the electric machine, coming for example from the inverter 60; the output 14 of the fourth operational amplifier 50 is connected, through a resistance R9, to the inverting input 2 of the third operational amplifier 40 and is further connected to a third output VA of the circuit, which is at a voltage value equal to the voltage of a third phase of the electric machine to be measured.

The measuring circuit 100 of the voltage of an electric machine then comprises three inputs, each electrically connected to the three phases A, B, C of the input current to the electric machine, coming for example from the inverter 60, and three outputs VA, VB, VC which are each at the value of the voltage of a phase of the electric machine to be measured.

The control system 200 of an electric machine 80, preferably a high-performance electric motor with permanent magnets of the invention comprises: a position sensor 51 of a known type, for example an encoder or a resolver, configured to detect the angular position of a rotor of the electric machine 80; at least two alternate current sensors 52, each one of the alternate current sensors 52 being configured to detect the value of the alternate current $i_a$, $i_b$, $i_c$ next to an input phase to the electric machine 80, and electrically connected to a phase of the supply circuit of the electric machine 80, the electric machine 80 being electrically connected to an inverter 60 configured to transform a continuous voltage supplied by the electric supply means into an alternate voltage for the power supply of the electric machine 80; and the measuring circuit 100 of the voltage of an electric machine of the invention.

The control system 200 of an electric machine 80 of the invention further comprises an electronic control unit of a known type comprising a microprocessor and memory means, configured to process, through suitable computer programs, the data detected by the sensors and drive the electric machine 80 to perform the control process of the invention described below.

The invention further comprises a high-performance electric motor with permanent magnets comprising the previously described control system 200.

The process for controlling an electric machine 80, preferably a high-performance electric motor with permanent magnets of the invention comprises the following steps:

a first step of detecting the angular position θ of a rotor of the electric machine 80 through a position sensor 51 of a known type, for example an encoder or a resolver;

a second step, simultaneous with the first step, of detecting the values of the alternate current $i_a$, $i_b$, $i_c$ next to at least two phases of the input current to the electric machine 80 through at least two alternate current sensors 52, each of the alternate current sensors 52 being electrically connected to a phase of the supply circuit of the electric machine 80, the electric machine 80 being electrically connected to an inverter 60 configured to transform a continuous voltage supplied by electric supply means into an alternate voltage for the power supply of the electric machine 80;

a third step, simultaneous with the first and the second step, of detecting the values of the phase voltage $V_A$, $V_B$, $V_C$ supplied as input to the electric machine 80 from the inverter 60, by means of the above-described measuring circuit 100 of the voltage of an electric machine;

a fourth step of estimating the torque $T_{estimated}$ supplied by the electric machine 80, performed by processing, preferably through a computer program executed by a microprocessor, the data detected by the position sensors 51 and the alternate current sensors 52 in the first and in the second step, and data obtained by means of known simulations of the electric machine 80;

a fifth step 500 of computing the torque $T_{check}$ supplied by the electric machine 80 performed by processing, preferably through a computer program executed by a microprocessor, the values of the phase voltage $V_A$, $V_B$, $V_C$ detected in the third step of the process as output to the above-described measuring circuit 100 of the voltage of an electric machine, the values detected in the first step of the process by the position sensor 51 from which the rotation speed is obtained (through processing by a computer program), the values of the alternate current $i_a$, $i_b$, $i_c$ detected in the second step of the process, next to at least two phases of the input current to the electric machine 80 through the at least two alternate current sensors 52, respectively in the previous third and first steps, and parameters of the electric machine 80;

a sixth step 600 of comparing between the value of the torque $T_{check}$ computed in the fifth step 500 and the value of the torque $T_{estimated}$ estimated in the fourth step, to verify that the difference between the two values is lower than a pre-set value, for example not greater than 10% or 10 Nm (taking into account that usually the required accuracy for controlling the torque $T_{estimated}$ is 5% or 5 Nm).

In a preferred way, in the fifth step 500 the computation of the torque $T_{check}$ provided by the electric machine 80 is performed by using the following formula:

$$T_{check} = \frac{P_{AC}\eta}{\omega}$$

wherein:

ω is the speed of the rotor of the electric machine 80 computed in a first sub-step 500a starting from the angular position θ of the rotor of the electric machine 80 detected by the position sensor 51; $P_{AC}$ is the value of the power of the electric machine 80 obtained in a known way by multiplying the phase voltages $V_A$, $V_B$, $V_C$ as output from the measuring circuit 100 of the voltage of an electric machine by the phase currents $i_A$, $i_B$, $i_c$ detected by the alternate current sensor 52 in the third step, and η is the efficiency of the electric machine 80.

In particular, the efficiency of the electric machine is known, since it can be computed with specific bench tests and afterwards can be tabulated in order to be used by the computer program.

Preferably, the fourth step of estimating the torque $T_{estimated}$ provided by the electric machine 80 comprises a first sub-step 400a wherein, using known Clarke Park transformations, direct current $i_d$ and quadrature current $i_q$ are computed.

In a preferred way, when the electric machine 80 is a synchronous motor with permanent magnets, the fourth step further comprises a second sub-step 400b wherein the estimation of the torque $T_{estimated}$ provided by the electric machine 80 is performed using the following formula, in the rotary reference system synchronous with the rotor:

$$T_{estimated} = \frac{3}{2} \cdot p \cdot i_q \cdot (\lambda + (L_d - L_q) \cdot i_d)$$

wherein:

p is the number of polar torques of the motor, $i_d$ and $i_q$ are respectively the direct current and the quadrature current computer in the first sub-step 400a, $L_d$ is the direct inductance travelled bz the direct current $i_d$, and $L_q$ is the quadrature inductance travelled by the quadrature current $i_q$, $\lambda$ is the concatenated flux, produced by the permanent magnets of the rotor and concatenated by the stator windings.

The invention claimed is:

1. A control system of an electric machine comprising:
   a position sensor configured to detect an angular position of a rotor of the electric machine;
   at least two alternate current sensors, each one of the alternate current sensors being configured to detect a value of an alternate current to an input phase to the electric machine, and being electrically connected to a phase of the supply circuit of the electric machine, the electric machine being electrically connected to an inverter configured to transform a continuous voltage supplied by the supply circuit into an alternate voltage for a power supply of the electric machine; and
   a measuring circuit of a voltage of an electric machine comprising a first operational amplifier having its non-inverting input connected to a non-inverting input of at least one second operational amplifier, and the first operational amplifier further having its output feedback connected, through a resistance, to the inverting input, the inverting input of the first operational amplifier being further connected through a resistance to a first phase of the input current to an electric machine, the output of the first operational amplifier being connected, through a resistance, to the inverting input of a third operational amplifier which has its non-inverting input connected to a reference voltage, the output of the first operational amplifier being further connected to a first output of the circuit, which is at a voltage value equal to the voltage of a first phase of the electric machine to be measured, the third operational amplifier having its output feedback connected, through a capacitance, to its inverting input, the output of the third operational amplifier being further connected through a resistance to the non-inverting input of the first operational amplifier and to the non-inverting input of the second operational amplifier, the second operational amplifier comprising an output of the second operational amplifier feedback connected, through a resistance, to the inverting input, the inverting input being further connected through a resistance to a second phase of the input current to the electric machine, the output of the second operational amplifier being connected, through a resistance, to the inverting input of the third operational amplifier and being further connected to a second output of the circuit, which is at a voltage value equal to the voltage of a second phase of the electric machine to be measured.

2. The control system of claim 1, wherein the measuring circuit of the voltage of an electric machine further comprises a fourth operational amplifier having its non-inverting input connected to the non-inverting input of the first operational amplifier and of the second operational amplifier, and its output feedback connected, through a resistance, to the inverting input, the inverting input being further connected through a resistance to a third phase of the input current to the electric machine, the output of the fourth operational amplifier being connected, through a resistance, to the inverting input of the third operational amplifier and being further connected to a third output of the measuring circuit, which is at a voltage value equal to the voltage of a third phase of the electric machine to be measured.

3. The control system of claim 1, further comprising an electronic control unit comprising a microprocessor and memory means, configured to process through suitable computer programs the data detected by the alternate current sensors and drive the electric machine.

4. An electric motor with permanent magnets comprising the control system of claim 1.

5. A process for controlling an electric machine comprising the following steps:
   a first step of detecting the angular position of a rotor of the electric machine;
   a second step, simultaneous with the first step, of detecting the values of the alternate current next to at least two phases of the input current to the electric machine;
   a third step, simultaneous with the first and the second step, of detecting the values of the phase voltage supplied as input to the electric machine, by means of a measuring circuit of the voltage of an electric machine in a control system including
      a position sensor configured to detect the angular position of a rotor of the electric machine,
      at least two alternate current sensors, each one of the alternate current sensors being configured to detect the value of the alternate current to an input phase to the electric machine, and being electrically connected to a phase of the supply circuit of the electric machine, the electric machine being electrically connected to an inverter configured to transform a continuous voltage supplied by the electric supply means into an alternate voltage for a power supply of the electric machine, and
      a measuring circuit of a voltage of an electric machine comprising a first operational amplifier having its non-inverting input connected to a non-inverting input of at least one second operational amplifier, and the first operational amplifier further having its output feedback connected, through a resistance, to the inverting input, the inverting input of the first operation amplifier being further connected through a resistance to a first phase of the input current to an electric machine, the output of the first operational amplifier being connected, through a resistance, to the inverting input of a third operational amplifier which has its non-inverting input connected to a reference voltage, the output of the first operational amplifier being further connected to a first output of the circuit, which is at a voltage value equal to the voltage of a first phase of the electric machine to be measured, the third operational amplifier having its output feedback connected, through a capacitance, to its inverting input, the output of the third operational amplifier being further connected through a resistance to the non-inverting input of the first operational amplifier and to the non-inventing input of the second operational amplifier, the second operational amplifier comprising an output of the second operational amplifier feedback connected, through a resistance, to the inverting input, the inverting input being further connected through a resistance to a second phase of the input current to the electric machine, the output of the second operational amplifier being connected, through a resistance, to the inverting input of the third operational amplifier and being further connected to a second output of the circuit, which is at a voltage value equal to the voltage of a second phase of the electric machine to be measured;
   a fourth step of estimating the torque provided by the electric machine performed by processing the data detected in the first and in the second step, and data obtained by simulations of the electric machine;

a fifth step of computing the torque provided by the electric machine performed by processing the values of the phase voltage detected in the third step of the process as output from the measuring circuit of the voltage of an electric machine, the values of the angular position detected in the first detecting step, the values of the alternate current detected in the second step of the process and parameters of the electric machine; and a sixth step of comparing between the value of the torque computed in the fifth step and the value of the torque estimated in the fourth step, to verify that the difference between the two values is lower than a pre-set value, not greater than 10% or 10 Nm, in order to control the torque of the electric machine.

6. The process of claim 5, wherein:

the first step of detecting the angular position of a rotor of the electric machine is performed through the position sensor;

the second step of detecting the values of the alternate current next to at least two phases of the input current to the electric machine is performed through at least two alternate current sensors, each one of the alternate current sensors being electrically connected to a phase of the supply circuit of the electric machine, the electric machine being electrically connected to the inverter for a power supply of the electric machine;

in the third step of detecting the values of the phase voltage, the phase voltage is detected supplied as input to the electric machine from the inverter;

the fourth step of estimating the torque provided by the electric machine is performed by processing the data detected by the position sensors and the alternate current sensors in the first and in the second steps, and data obtained by means of simulations of the electric machine;

the fifth step of computing the torque provided by the electric machine is performed by processing the values detected by the position sensors and the alternate current sensors respectively in the previous first and second steps; and in the sixth step a comparison is performed between the value of the torque computed in the fifth step and the value of the torque estimated in the fourth step to verify that the difference between the two values is lower than a pre-set value, thereby controlling the torque of the electric machine.

7. The process of claim 5, wherein, in the fifth step, the computation of the torque provided by the electric machine is performed by using the following formula:

$$T_{check} = \frac{P_{AC}\eta}{\omega}$$

wherein:

$\omega$ is a speed of the rotor of the electric machine computed in a first sub-step starting from the angular position of the rotor of the electric machine detected by the position sensor; PAC is a value of the power of the electric machine, and $\eta$ is an efficiency of the electric machine.

8. The process of claim 5, wherein the fourth step of estimating the torque provided by the electric machine comprises a first sub-step wherein direct current and quadrature current are computed.

* * * * *